(12) United States Patent
Dutta et al.

(10) Patent No.: US 11,955,152 B2
(45) Date of Patent: Apr. 9, 2024

(54) DIELECTRIC FILL FOR TIGHT PITCH MRAM PILLAR ARRAY

(71) Applicant: INTERNATIONAL BUSINESS MACHINES CORPORATION, Armonk, NY (US)

(72) Inventors: Ashim Dutta, Clifton Park, NY (US); Chih-Chao Yang, Glenmont, NY (US); Theodorus E. Standaert, Clifton Park, NY (US); Daniel Charles Edelstein, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 167 days.

(21) Appl. No.: 17/541,401

(22) Filed: Dec. 3, 2021

(65) Prior Publication Data

US 2023/0178129 A1   Jun. 8, 2023

(51) Int. Cl.
| | |
|---|---|
| *G11C 11/16* | (2006.01) |
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ...... G11C 11/161; H10B 61/00; H10N 50/01; H10N 50/10; H10N 50/80; H10N 50/85

USPC .................................................. 365/158, 173
See application file for complete search history.

(56) References Cited

U.S. PATENT DOCUMENTS

| | | | |
|---|---|---|---|
| 8,455,965 B2 | 6/2013 | Li et al. | |
| 9,343,659 B1 | 5/2016 | Lu et al. | |
| 9,564,577 B1 | 2/2017 | Hsu et al. | |
| 9,935,261 B1 | 4/2018 | Patel et al. | |

(Continued)

FOREIGN PATENT DOCUMENTS

| | | | | |
|---|---|---|---|---|
| DE | 102016117034 A1 | * | 7/2017 | ........... H01L 27/228 |
| TW | 202105663 A | * | 2/2021 | ......... H01L 21/4853 |
| WO | WO-2022233249 A1 | * | 11/2022 | ........... H01L 27/222 |

OTHER PUBLICATIONS

Das, Jayita, Auxiliary Roles in STT-MRAM Memory, 2014, University of South Florida. All pages. (Year: 2014).*

*Primary Examiner* — Michael T Tran
(74) *Attorney, Agent, or Firm* — Tutunjian & Bitetto, P.C.; L. Jeffrey Kelly (57) ABSTRACT

A semiconductor device includes a bottom electrode contact disposed over one or more of a plurality of conductive lines, magnetoresistive random access memory (MRAM) pillars constructed over the bottom electrode contact, an encapsulation layer section disposed between a pair of the MRAM pillars such that an aspect ratio of a tight pitch gap between the pair of the MRAM pillars is reduced, and a dielectric disposed within the encapsulation layer section, wherein the dielectric fills an entirety of a space defined within the encapsulation layer section. The MRAM pillars have a generally rectangular-shaped or cone-shaped configuration and the encapsulation layer section has a generally U-shaped or V-shaped configuration.

20 Claims, 7 Drawing Sheets

(56) References Cited

U.S. PATENT DOCUMENTS

| | | | |
|---|---|---|---|
| 10,636,963 B2 | 4/2020 | Dai et al. | |
| 10,692,925 B2* | 6/2020 | Rizzolo et al. | |
| 10,693,054 B2* | 6/2020 | Shum | H10B 61/00 |
| 11,195,993 B2* | 12/2021 | Rizzolo | H01F 10/3254 |
| 11,227,892 B2* | 1/2022 | Dutta | H10B 61/00 |
| 2013/0119494 A1 | 5/2013 | Li et al. | |
| 2016/0190439 A1* | 6/2016 | Oh | H10N 70/826 |
| | | | 257/4 |
| 2016/0365505 A1 | 12/2016 | Lu et al. | |
| 2019/0229261 A1* | 7/2019 | Hsieh | H10N 50/01 |
| 2020/0035906 A1* | 1/2020 | Shum | H10B 61/00 |
| 2020/0105829 A1* | 4/2020 | Boone | H10B 61/00 |
| 2020/0119089 A1* | 4/2020 | Rizzolo | H10B 61/00 |
| 2020/0312704 A1* | 10/2020 | Seo | H10B 63/80 |
| 2020/0403032 A1* | 12/2020 | Dutta | H10N 50/01 |
| 2021/0083179 A1* | 3/2021 | Rizzolo | H10N 50/80 |
| 2021/0091302 A1* | 3/2021 | Reznicek | H10B 61/00 |
| 2021/0159271 A1* | 5/2021 | Reznicek | H10B 61/22 |
| 2021/0233812 A1* | 7/2021 | Reznicek | H01L 21/76843 |
| 2021/0296574 A1* | 9/2021 | Reznicek | H10N 50/85 |
| 2021/0336128 A1* | 10/2021 | Reznicek | H10N 50/01 |
| 2021/0351342 A1* | 11/2021 | Yui | H10N 52/80 |
| 2021/0367145 A1* | 11/2021 | Chou | H10N 50/80 |
| 2021/0375986 A1* | 12/2021 | Dutta | H10N 50/80 |
| 2021/0407966 A1* | 12/2021 | Wu | H01L 23/5384 |
| 2022/0359814 A1* | 11/2022 | Standaert | H10N 50/80 |

\* cited by examiner

DIELECTRIC FILL FOR TIGHT PITCH MRAM PILLAR ARRAY

BACKGROUND

The present invention relates generally to semiconductor devices, and more specifically, to enabling a dielectric fill for tight pitch magnetic or magnetoresistive random access memory (MRAM) pillar arrays.

Unlike conventional random access memory (RAM) chip technologies, magnetic or magnetoresistive RAM (MRAM) does not store data as electric charge, but instead stores data by magnetic polarization of storage elements. Usually, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (e.g., anti-parallel polarity to the fixed layer) or "0" (e.g., parallel polarity to the fixed layer). One device having a fixed layer, a tunneling layer, and a free layer is a magnetic tunnel junction.

SUMMARY

In accordance with an embodiment, a semiconductor device is provided. The semiconductor device includes a bottom electrode contact disposed over one or more of a plurality of conductive lines, MRAM pillars constructed over the bottom electrode contact, an encapsulation layer section disposed between a pair of the MRAM pillars such that an aspect ratio of a tight pitch gap between the pair of the MRAM pillars is reduced, and a dielectric disposed within the encapsulation layer section, wherein the dielectric fills an entirety of a space defined within the encapsulation layer section.

In accordance with another embodiment, a method is provided for forming an embedded magnetoresistive random access memory (MRAM) device. The method includes forming a bottom electrode contact over one or more of a plurality of conductive lines, constructing MRAM pillars over the bottom electrode contact, depositing an encapsulation layer over the MRAM pillars to define a tight pitch gap between a pair of the MRAM pillars, etching the encapsulation layer to form a generally U-shaped gap between the pair of MRAM pillars such that an aspect ratio of the tight pitch gap is reduced, and depositing a dielectric within the generally U-shaped gap between encapsulation layer portions of two adjacent MRAM pillars, wherein the dielectric fills an entirety of a space defined within the generally U-shaped gap.

In accordance with yet another embodiment, a method is provided for forming an embedded magnetoresistive random access memory (MRAM) device. The method includes forming a bottom electrode contact over one or more of a plurality of conductive lines, constructing MRAM pillars over the bottom electrode contact, wherein the MRAM pillars have a cone-shaped configuration, depositing an encapsulation layer over the MRAM pillars to define a tight pitch gap between a pair of the MRAM pillars, etching the encapsulation layer to form a generally V-shaped gap between the pair of MRAM pillars such that an aspect ratio of the tight pitch gap is reduced, and depositing a dielectric within the generally V-shaped gap between encapsulation layer portions of two adjacent MRAM pillars, wherein the dielectric fills an entirety of a space defined within the generally V-shaped gap.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

In embedded magnetic or magnetoresistive random access memory (MRAM) pillar formation processes, it is challenging to avoid seam or void formation in between pillars (referred to as the inter-layer dielectric (ILD) void issue). This is especially true for most advanced future products with high density. The seam reduces breakdown strength of the dielectric and degrades the device reliability. This ILD void issue becomes more challenging for tighter pitch MRAM pillar arrays for 14 nm technology and beyond.

Embodiments in accordance with the present invention alleviate such ILD void issue by providing methods and devices for forming an embedded MRAM device where the aspect ratio of the gap between two MRAM pillars in a tight pitch region is reduced to ensure a void free dielectric fill. In one embodiment, the aspect ratio of the tight pitch gap is reduced by retaining more dielectric during the MRAM pillar formation and encapsulation etch back process. In another embodiment, the sidewall profile of the gap is modified along with the depth to enable better fill of the dielectric. Thus, MRAM device density scaling is significantly improved by improving ILD fill in between MRAM pillars in tight pitch memory arrays.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
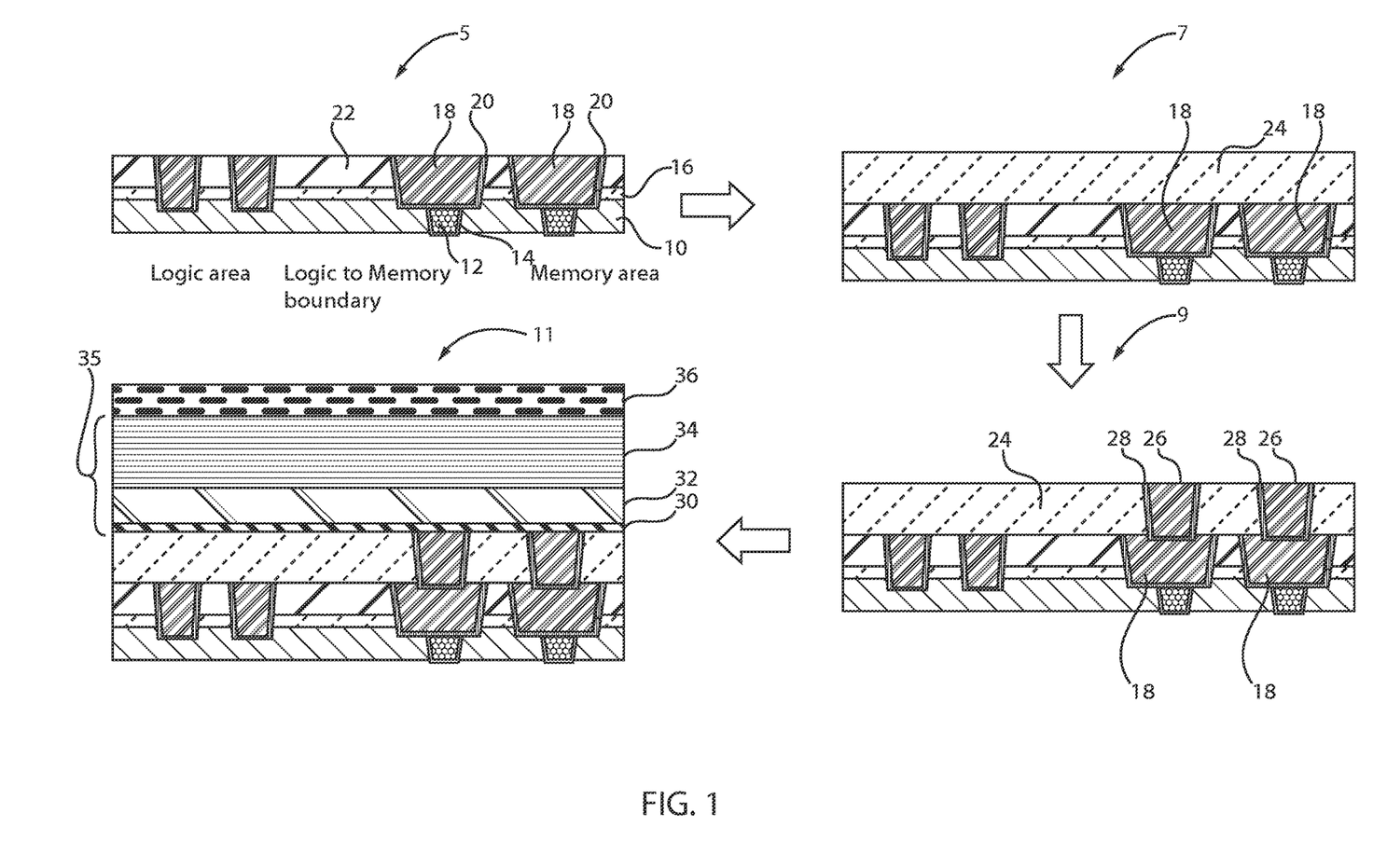
FIG. 1 is a cross-sectional view of a semiconductor structure that includes a plurality of conductive lines formed within dielectric layers, where a cap layer is deposited over the plurality of conductive lines, a bottom electrode contact is formed, and an MRAM stack is deposited, in accordance with an embodiment of the present invention.

FIG. 1 is a cross-sectional view of a semiconductor structure that includes a plurality of conductive lines formed within dielectric layers, where a cap layer is deposited over the plurality of conductive lines, a bottom electrode contact is formed, and an MRAM stack is deposited, in accordance with an embodiment of the present invention.

In various exemplary embodiments, structure 5 includes a plurality of conductive contacts 12 formed within vias of a first inter-layer dielectric (ILD) 10. A conductive fill material or liner 14 can be formed or deposited around each of the trenches accommodating the plurality of conductive contacts 12. A capping layer 16 is formed over the plurality of conductive contacts 12. A second ILD 22 is then formed over the capping layer 16. A plurality of conductive lines 18 are formed within the second ILD 22 and extend through the capping layer 16 and into the first ILD 10. A conductive fill material or liner 20 can be formed or deposited around each of the trenches accommodating the plurality of conductive lines 18. The plurality of conductive lines 18 are formed within both the logic and memory area.

Structure 7 illustrates a capping layer 24 deposited over the plurality of conductive lines 18. The capping layer 24 directly contacts the top surface of the plurality of conductive lines 18.

Structure 9 illustrates bottom electrode contacts 26 formed over one or more of the plurality of conductive lines 18. A conductive fill material or liner 28 can be formed or deposited around each of the vias accommodating the bottom electrode contacts 26.

Structure 11 illustrates an MRAM stack 35 formed over the bottom electrode contacts 26. The MRAM stack 35 includes a bottom electrode 30, an MTJ stack 32, and a top electrode 34. A hardmask 36 is deposited over the top electrode 34. The MTJ stack 32 can include a ferromagnetic layer or reference layer, an insulator or barrier layer, and another ferromagnetic layer or free layer on top.

The first and second ILDs 10, 22 can include any materials known in the art, such as, for example, porous silicates, carbon doped oxides, silicon dioxides, silicon nitrides, silicon oxynitrides, or other dielectric materials. The first and second ILDs 10, 22 can be formed using any method known in the art, such as, for example, chemical vapor deposition, plasma enhanced chemical vapor deposition, atomic layer deposition, or physical vapor deposition. The first and second ILDs 10, 22 can have a thickness ranging from about 25 nm to about 200 nm.

The dielectric material of first and second ILDs 10, 22 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The conductive contacts 12 and the conductive lines 18 can be any conductive materials known in the art, such as, for example, copper (Cu), aluminum (Al), cobalt (Co), ruthenium (Ru) or tungsten (W). The conductive contacts/lines 12, 18 can be fabricated using any technique known in the art, such as, for example, a single or dual damascene technique. In an embodiment, the conductive contacts/lines 12, 18 can be copper (Cu) and can include the liner 14, 20, where the liner 14, 20 can be metals, such as, for example, tantalum nitride and tantalum (TaN/Ta), titanium, titanium nitride, cobalt, ruthenium, and manganese.

In one example, the liner 14, 20 can be a tantalum nitride (TaN) liner or in the alternative a tantalum (Ta) liner. In one example embodiment, the liner 14, 20 can be deposited, for example, by electroplating, electroless plating, chemical vapor deposition (CVD), atomic layer deposition (ALD) and/or physical vapor deposition (PVD).

The capping layers 16 and 24 can be referred to as etch stop layers. The capping layers 16, 24 can be formed of, e.g., silicon nitride (SiN) or silicon carbon nitride (SiCN) (nBLOK).

The bottom electrode contacts 26 can be, e.g., formed from Ta, Ti/TiN, W, WN, TaN, polysilicon, doped polysilicon, amorphous silicon, doped amorphous silicon, or any other suitable material, or any other conductive material. Alternatively, the bottom electrode contacts 26 can be, e.g., any suitable conductive material or materials, e.g., Ag, Al, Cu, TaN, Ti, TiN, Al or any other suitable material, and can be deposited or formed in any suitable manner.

The bottom electrode 30 and the top electrode 34 can include Nb, NbN, W, WN, Ta, TaN, Ti, TiN, Ru, Mo, Cr, V, Pd, Pt, Rh, Sc, Al or other high melting point metals or conductive metal nitrides. The bottom electrode 30 and the top electrode 34 can be formed, for example, by CVD, PECVD or ALD. The thickness of bottom electrode ranges from 5 nm to 50 nm and the thickness of top electrode can be between 30 nm to 200 nm.

The hardmask 36 can include a dielectric oxide or dielectric nitride. In one embodiment, the hardmask 36 includes silicon dioxide. The hardmask 36 can be formed, for example, by CVD, PECVD or ALD. The thickness of the hardmask 36 can be from about 10 nm to about 80 nm, although lesser and greater thicknesses can also be employed.

Magnetic Tunneling Junction (MTJ) devices include two ferromagnetic films, or plates, separated by a thin insulating layer to form magnetic storage elements. It will be recognized that the magnetic material can be any suitable material, combination of materials, or alloy that exhibits magnetic properties, such as a ferromagnetic material or a ferromagnetic thin film including CoFe, CoFeB, NiFe, etc. By sharing magnetic random access memory (MRAM) manufacturing processes with magnetic film integration techniques, the embodiments described herein can more efficiently provide integrated magnetic field enhanced circuit elements.

Figure 2:
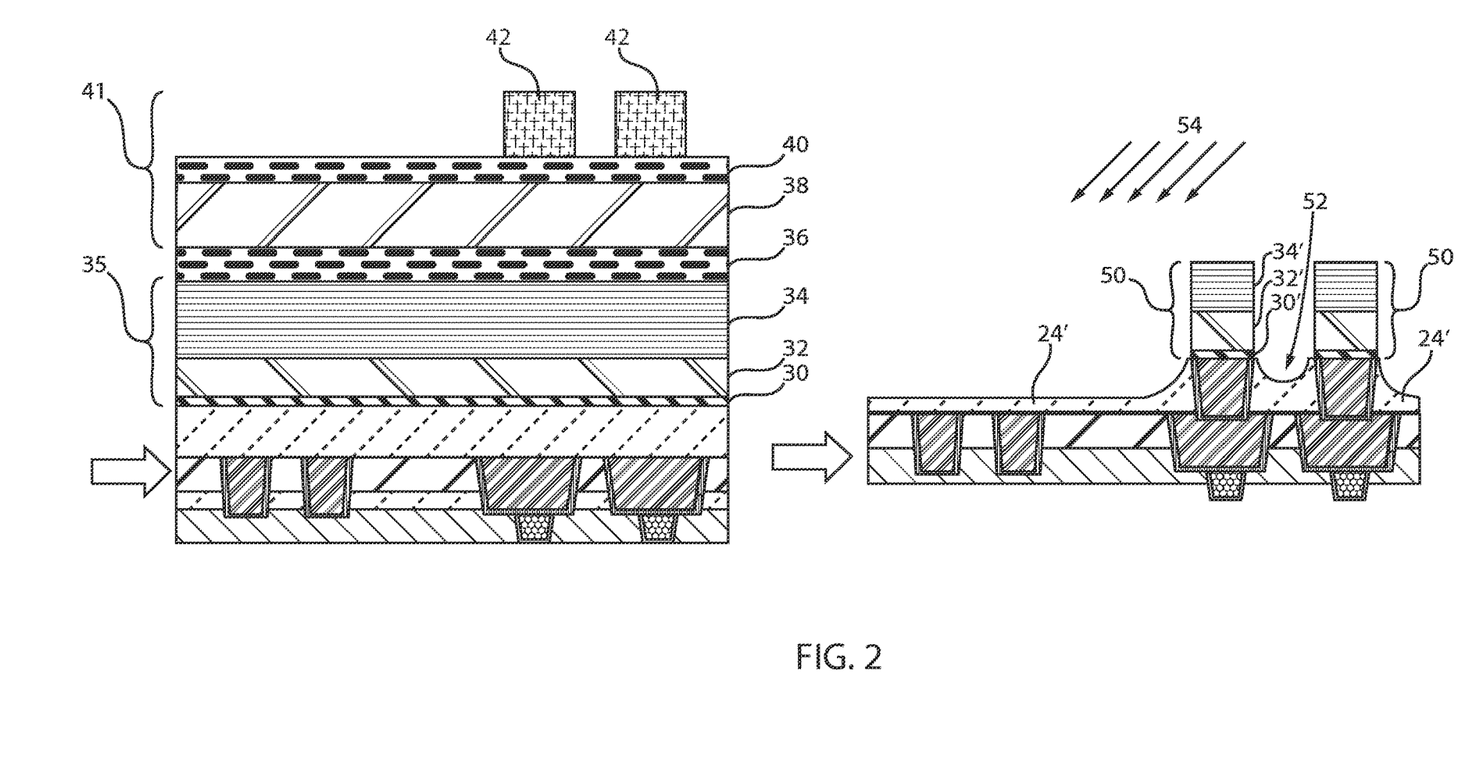
FIG. 2 is a cross-sectional view of the semiconductor structure of FIG. 1 where a lithographic stack is deposited and patterned to create MRAM pillars over the bottom electrode contacts, in accordance with an embodiment of the present invention.

FIG. 2 is a cross-sectional view of the semiconductor structure of FIG. 1 where a lithographic stack is deposited and patterned to create MRAM pillars over the bottom electrode contacts, in accordance with an embodiment of the present invention.

In various exemplary embodiments, a lithographic stack 41 is deposited. The lithographic stack 41 includes an organic planarization layer (OPL) 38, an antireflective hard mask layer 40, and a photoresist 42. The lithographic stack 41 is then etched by, e.g., reactive ion etch (RIE) and IBE 54 to create MRAM pillars 50. The MRAM pillars 50 can be rectangular-shaped.

The MRAM pillars 50 are formed by removing the OPL 38, the antireflective hard mask layer 40, and the photoresist 42, and etching the MRAM stack 35. The MRAM pillars 50 remain over the bottom electrode contacts 26 in the MRAM region.

Each MRAM pillar 50 now includes a bottom electrode 30', an MTJ stack 32', and a top electrode 34'. Additionally, dielectric capping layer sections 24' remain after the RIE and IBE 54. A dielectric capping layer section 24' between the two MRAM pillars 50 indicates a tight pitch region 52 that has less dielectric gouge due to IBE shadowing. The MRAM pillars 50 can be referred to as a pair of MRAM pillars.

Pitch is the spacing between objects without regard to their size in a circuit. The pitch of parallel conducting lines is the distance between them, center to center. The width of the lines can be anything less than the pitch and there will still be space between the lines. The pitch of transistors is similar, that is, it is the distance from the center of one transistor to the center of another. Pitch allows a designed to directly deduce the density of transistors (how many per unit area) under ideal circumstances. A "tight pitch" herein refers to, e.g., a pitch defined at 1× design rule. Stated differently, tight pitch of interconnects are defined at the minimum line resolution of the lithography and etch capability for a technology process node, which may be referred to as the 1× design rule. Metal levels with 1× design rules may also be referred to as thin wire levels. For example, y number of the plurality of ILD levels may be defined at 1× design rule. The number of ILD levels defined with 1× design rule may depend on, for example, design requirements or the logic process involved.

The etch can, for example, include a wet etch such as a phosphoric acid ($H_3PO_4$)(wet chemistry) etch or a diluted hydrogen fluoride (HF) etch. In another embodiment, the top electrode 34 of the MRAM stack 35 can be etched with a RIE and/or an Ion Beam Etching (IBE) process employing one or more gases including C, H, and O such as $CH_3OH$, $C_2H_5OH$ or a gas mixture including ammonia ($NH_3$) and carbon monoxide (CO), $NH_3$ and methane ($CH_4$) or $CH_3$ and ethylene ($C_2H_4$) as an etchant.

The OPL 38 can include an organic planarization material, which is a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the OPL 38 forms a planar horizontal surface. Exemplary organic planarization materials include, but are not limited to, near-frictionless carbon (NFC) material, diamond-like carbon, polyarylene ether, and polyimide. The OPL 38 can be deposited, for example, by spin coating. The thickness of the OPL 38 can be from about 100 nm to about 500 nm, although lesser and greater thicknesses can also be employed.

The antireflective hard mask layer 40 is formed on the OPL 38. The antireflective hard mask layer 40 can include an antireflective coating material. The antireflective hard mask layer 40 is employed in the lithographic process to improve the photoresist profile and to reduce the line width variation caused by scattering and reflecting light. The antireflective hard mask layer 40 can include a silicon-containing antireflective coating (SiARC) material, a titanium-containing antireflective coating material (TiARC), silicon nitride, silicon oxide or TiN. In one embodiment, the antireflective hard mask layer 40 includes a SiARC material. The antireflective hard mask layer 40 can be applied, for example, by spin coating or CVD. The thickness of the antireflective hard mask layer 40 can be from about 10 nm to about 150 nm, although lesser and greater thicknesses can also be employed.

The photoresist 42 is deposited as a blanket layer atop the antireflective hard mask layer 40, for example, by spin coating. The photoresist 42 can include any organic photoresist material such as, for example, methacrylates or polyesters. The photoresist 42 can have a thickness from about 30 nm to about 500 nm, although lesser and greater thicknesses can also be employed. The photoresist 42 is deposited in the MRAM region.

Figure 3:
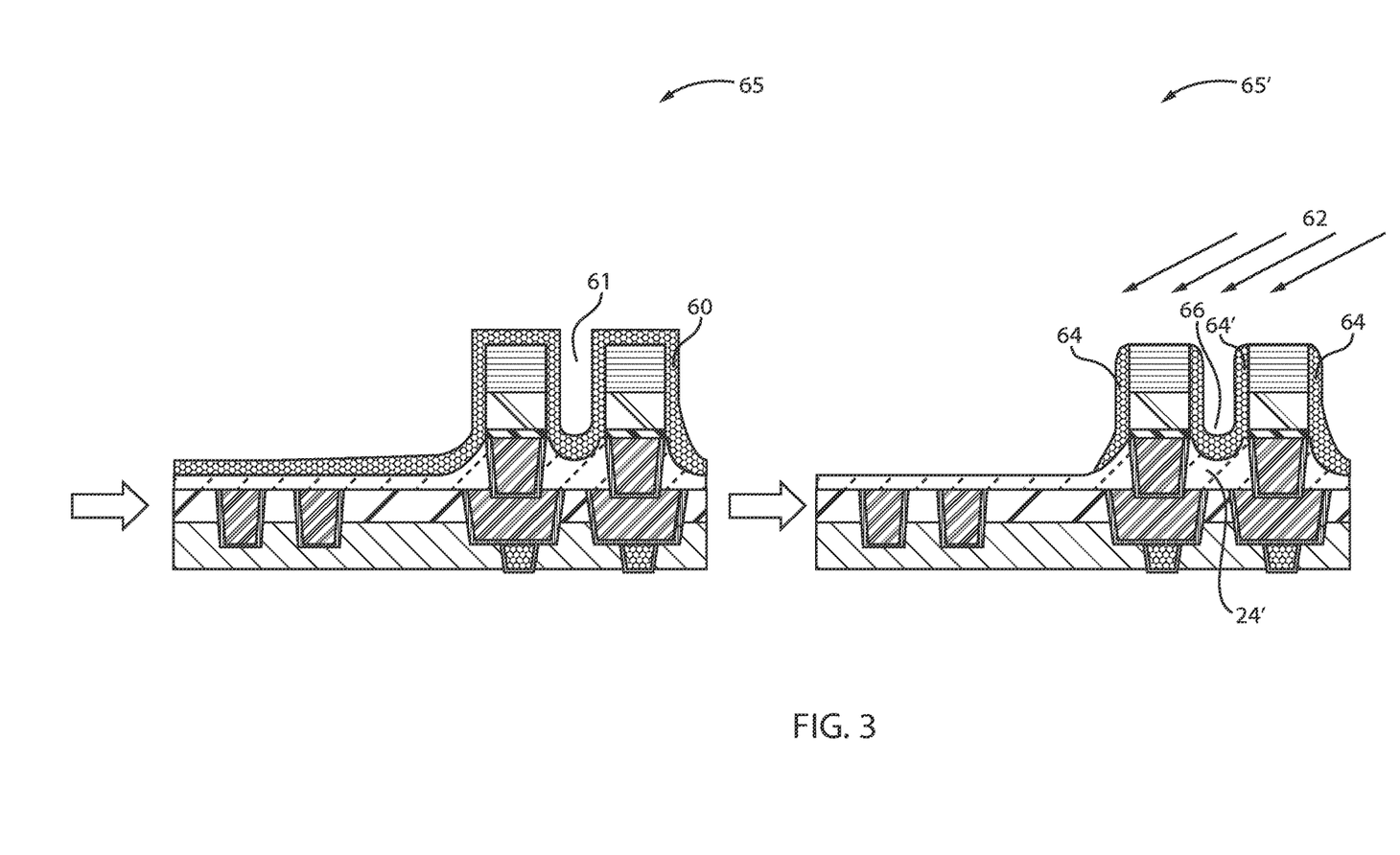
FIG. 3 is a cross-sectional view of the semiconductor structure of FIG. 2 where an encapsulation layer is deposited and an ion beam etch is performed such that encapsulation layer sections remain adjacent the MRAM pillars, in accordance with an embodiment of the present invention.

FIG. 3 is a cross-sectional view of the semiconductor structure of FIG. 2 where an encapsulation layer is deposited and an ion beam etch is performed such that encapsulation layer sections remain adjacent the MRAM pillars, in accordance with an embodiment of the present invention.

In various exemplary embodiments, an encapsulation layer 60 is deposited such that an opening or gap 61 remains between the pair of MRAM pillars 50 in structure 65. The encapsulation layer 60 directly contacts the top surface and sidewalls of the MRAM pillars 50. The encapsulation layer 60 directly contacts the tight pitch region 52 formed between the MRAM pillars 50. The opening or gap 61 is substantially or generally U-shaped.

In structure 65', the encapsulation layer 60 is etched by, e.g., ion beam etch 62 such that encapsulation layer sections 64, 64' remain. Encapsulation layer sections 64 are formed on outer surfaces of the pair of MRAM pillars 50, whereas encapsulation layer section 64' is formed between the pair MRAM pillars 50 such that an opening or gap 66 is formed therebetween.

The encapsulation layer 60 can be deposited using a deposition process, for example, CVD or PVD. Non-limiting examples of materials for the encapsulation layer 60 include dielectric oxides (e.g., silicon dioxide), dielectric nitrides (e.g., $Si_xN_y$), dielectric oxynitrides (e.g., $SiO_xN_y$), or any combination thereof.

The encapsulation layer 60 can have a thickness that generally varies and depends on the type of material(s) and the type of device. In some embodiments, the encapsulation layer 60 has a thickness in a range from about 10 to about 100 nm. In other embodiments, the encapsulation layer 60 has a thickness in a range from about 20 to about 40 nm.

Figure 4:
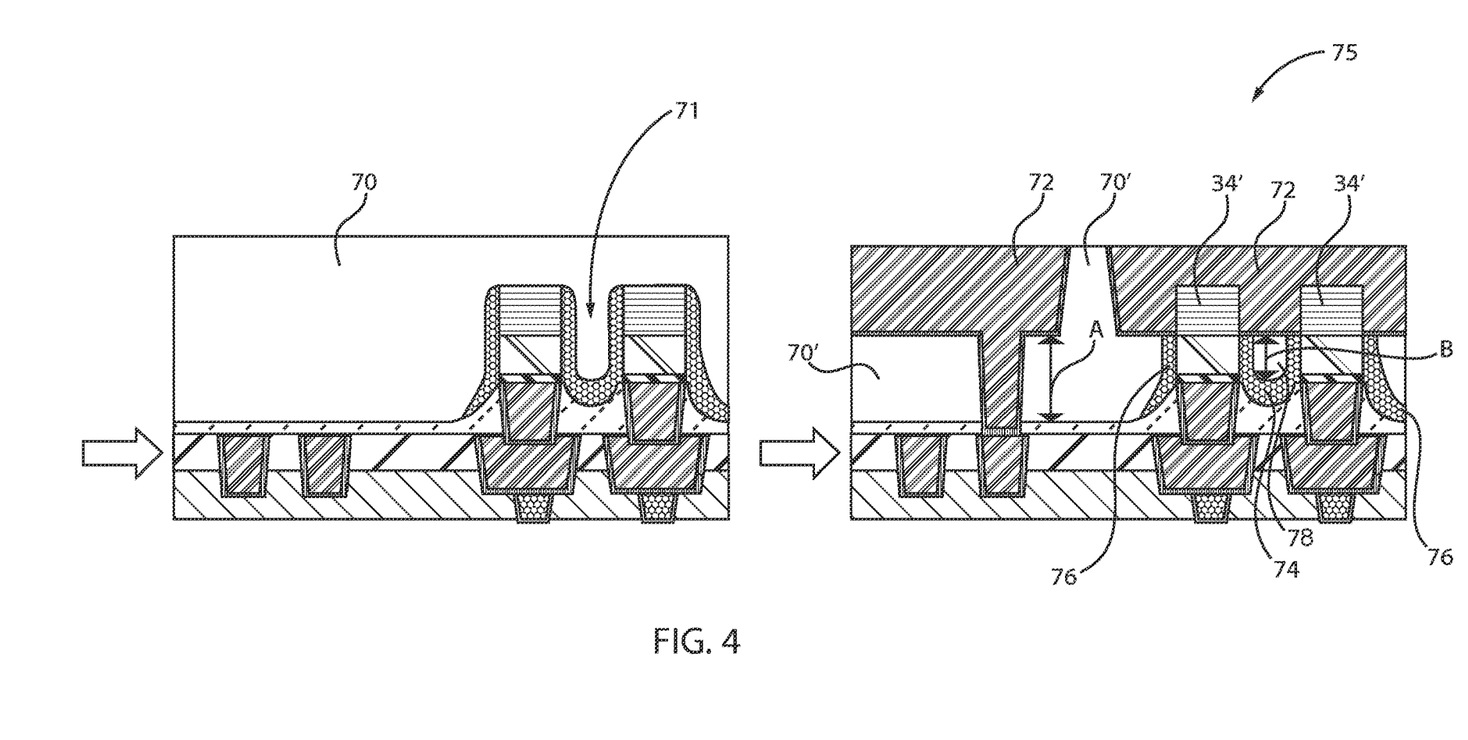
FIG. 4 is a cross-sectional view of the semiconductor structure of FIG. 3 where a dielectric fill takes place and top electrode contacts are formed, in accordance with an embodiment of the present invention.

FIG. 4 is a cross-sectional view of the semiconductor structure of FIG. 3 where a dielectric fill takes place and top electrode contacts are formed, in accordance with an embodiment of the present invention.

In various exemplary embodiments, a dielectric fill 70 takes place and top electrode contacts 72 are subsequently formed after the dielectric is etched. The dielectric fill 70 extends into region 71 defined between the MRAM pillars 50. The remaining dielectric is designated as 70'. The top electrode contact 72 directly contacts top portions of the pair of MRAM pillars 50. In particular, the top electrode contact 72 directly contacts the top electrode 34' of the MRAM pillars 50. The top electrode contact 72 is formed over exposed top portions of the MRAM pillars 50.

The etching results in encapsulation layer portions 74, 76 in structure 75. Encapsulation layer portions 74 are defined on outer surfaces of the pair of MRAM pillars 50, whereas encapsulation layer portion 76 is defined in an area or region defined directly between the pair of MRAM pillars 50. The encapsulation layer portion 76 defines a substantially or generally U-shaped configuration or U-shaped gap. A dielectric region 78 is confined within the encapsulation layer portion 76. The dielectric capping layer section 24' is positioned directly underneath the encapsulation layer portion 74.

Distance "A" denotes an amount of dielectric between the dielectric capping layer section 24' and a bottom surface of the top electrode contact 72. Distance "B" denotes the dielectric region 78 between the encapsulation layer portion 76 and a bottom surface of another top electrode contact 72. The dielectric completely fills this region between or confined within the U-shaped gap. Thus, a depth of the gap between MRAM pillars 50 in the tight pitch region is smaller than other wider pitch regions or logic areas, such that B<A. Void free dielectric fill is also ensured.

The dielectric region 78 does not include any voids. Thus, the aspect ratio of the gap between MRAM pillars 50 in a tight pitch region is reduced to ensure a void free dielectric fill. The dielectric region 78 extends below a bottom surface of the MRAM pillars 50. A height (and/or pitch) of the dielectric region 78 is indicated by arrow "B."

The dielectric fill 70 can include, but is not limited to, ultra-low-k (ULK) materials, such as, for example, porous silicates, carbon doped oxides, silicon oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4. The dielectric fill 70 can further include aluminum oxides and hafnium oxides.

In some embodiments, the dielectric fill 70 can be conformally deposited using CVD. Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

The top electrode contacts 72 can be, e.g., formed from Ta, Ti/TiN, W, WN, TaN, polysilicon, doped polysilicon, amorphous silicon, doped amorphous silicon, or any other suitable material, or any other conductive material. Alternatively, the top electrode contacts 72 can be, e.g., any suitable conductive material or materials, e.g., Ag, Al, Cu, TaN, Ti, TiN, Al or any other suitable material, and can be deposited or formed in any suitable manner.

In various exemplary embodiments, the height of the top electrode contacts 72 can be reduced by CMP and/or etching. Therefore, the planarization process can be provided by CMP. Other planarization process can include grinding and polishing.

Figure 5:
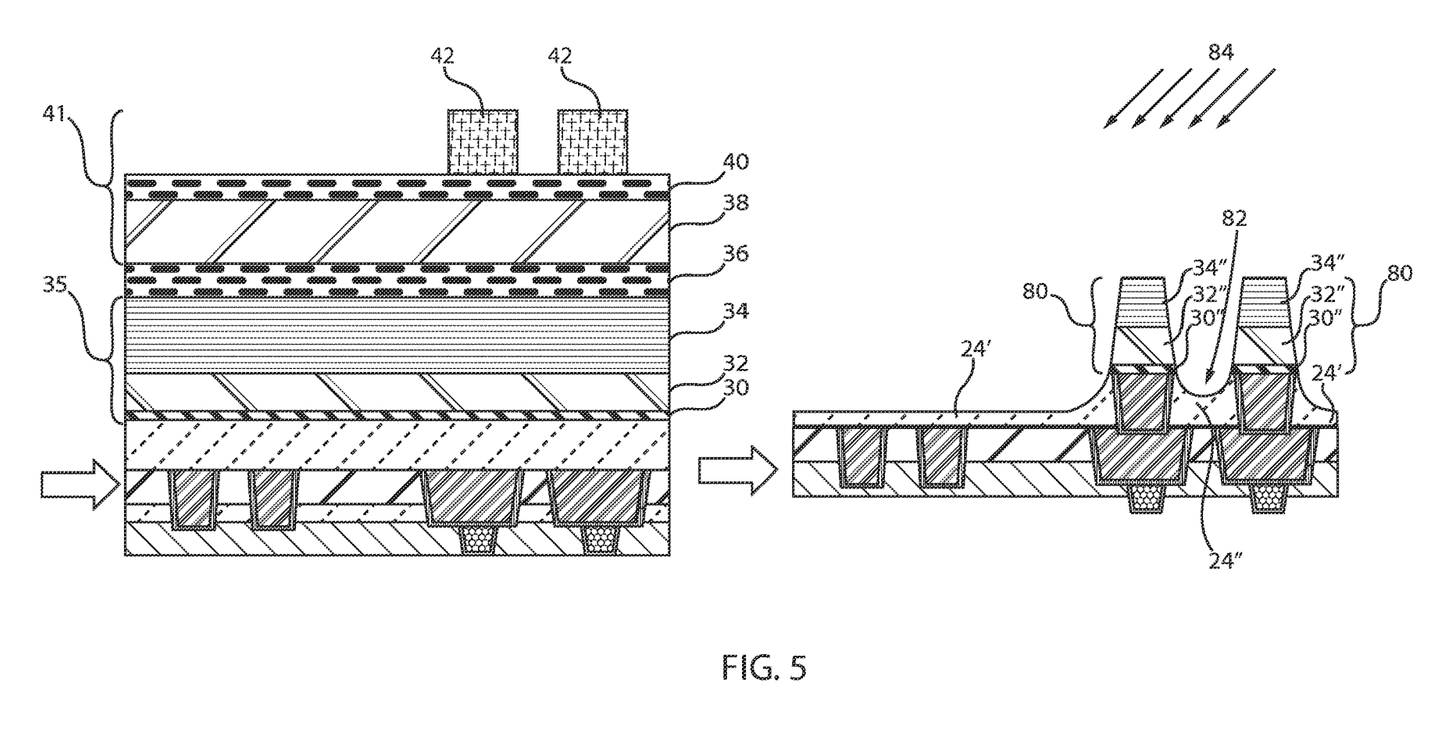
FIG. 5 is a cross-sectional view of the semiconductor structure where the lithographic stack is patterned to form MRAM pillars with a tight pitch region having less dielectric gouge, in accordance with an embodiment of the present invention.

FIG. 5 is a cross-sectional view of the semiconductor structure where the lithographic stack is patterned to form MRAM pillars with a tight pitch region having less dielectric gouge, in accordance with an embodiment of the present invention.

In various exemplary embodiments, a lithographic stack 41 is deposited. The lithographic stack 41 includes an organic planarization layer (OPL) 38, an antireflective hard mask layer 40, and a photoresist 42. The lithographic stack 41 is then etched by, e.g., reactive ion etch (RIE) and IBE 84 to create MRAM pillars 80.

The MRAM pillars 80 are formed by removing the OPL 38, the antireflective hard mask layer 40, and the photoresist 42, and etching the top electrode 34 of the MRAM stack 35. The MRAM pillars 80 remain over the bottom electrode contacts 26 in the MRAM region.

Each MRAM pillar 80 now includes a bottom electrode 30", an MTJ stack 32", and a top electrode 34". Additionally, dielectric capping layer sections 24' remain after the RIE and IBE 84. A dielectric capping layer section 24' between the two MRAM pillars 80 indicates a tight pitch region 82 that has less dielectric gouge due to IBE shadowing.

The MRAM pillars 80 define more of a conical shape compared to the MRAM pillars 50 of FIGS. 2-4. Thus, the top or upper section of the MRAM pillars 80 is narrower than the bottom or lower section of the MRAM pillars 80. This results is an even tighter pitch region 82 compared to the tight pitch region 52 of FIG. 2.

Figure 6:
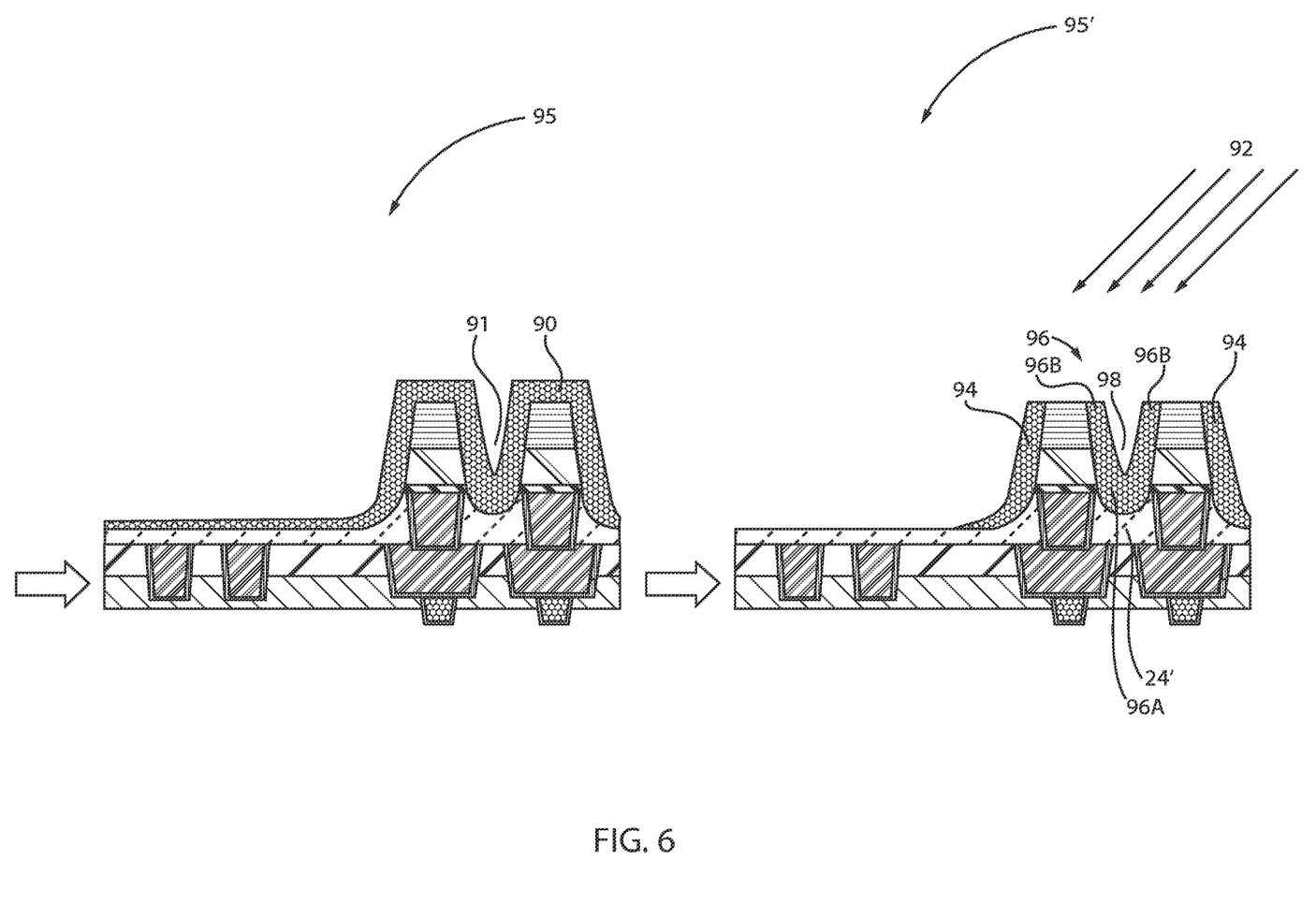
FIG. 6 is a cross-sectional view of the semiconductor structure of FIG. 5 where an encapsulation layer is deposited and an ion beam etch is performed such that encapsulation layer sections remain adjacent the MRAM pillars, in accordance with an embodiment of the present invention.

FIG. 6 is a cross-sectional view of the semiconductor structure of FIG. 5 where an encapsulation layer is deposited and an ion beam etch is performed such that encapsulation layer sections remain adjacent the MRAM pillars, in accordance with an embodiment of the present invention.

In various exemplary embodiments, an encapsulation layer 90 is deposited such that an opening or gap 91 remains between the pair of MRAM pillars 80 in structure 95. The encapsulation layer 90 directly contacts the top surface and sidewalls of the pair of MRAM pillars 80. The encapsulation layer 90 directly contacts the tight pitch region 82 formed between the MRAM pillars 80. The gap 91 is more of a V-shaped configuration compared to the gap 61 of FIG. 3 which has more of a U-shaped configuration. The V-shaped configuration or V-shaped gap is a result of the cone-shaped MRAM pillars 80.

In structure 95', the encapsulation layer 90 is etched by, e.g., ion beam etch 92 such that encapsulation layer sections 94, 96 remain (with upper sections 96B and lower section 96A defined for 96). Encapsulation layer sections 94 are formed on outer surfaces of the pair of MRAM pillars 80, whereas upper and lower sections 96B, 96A are formed between the pair of MRAM pillars 80 such that an opening or gap 98 is formed therebetween. The lower section 96A extends below a top surface of the bottom electrode contact 26.

Figure 7:
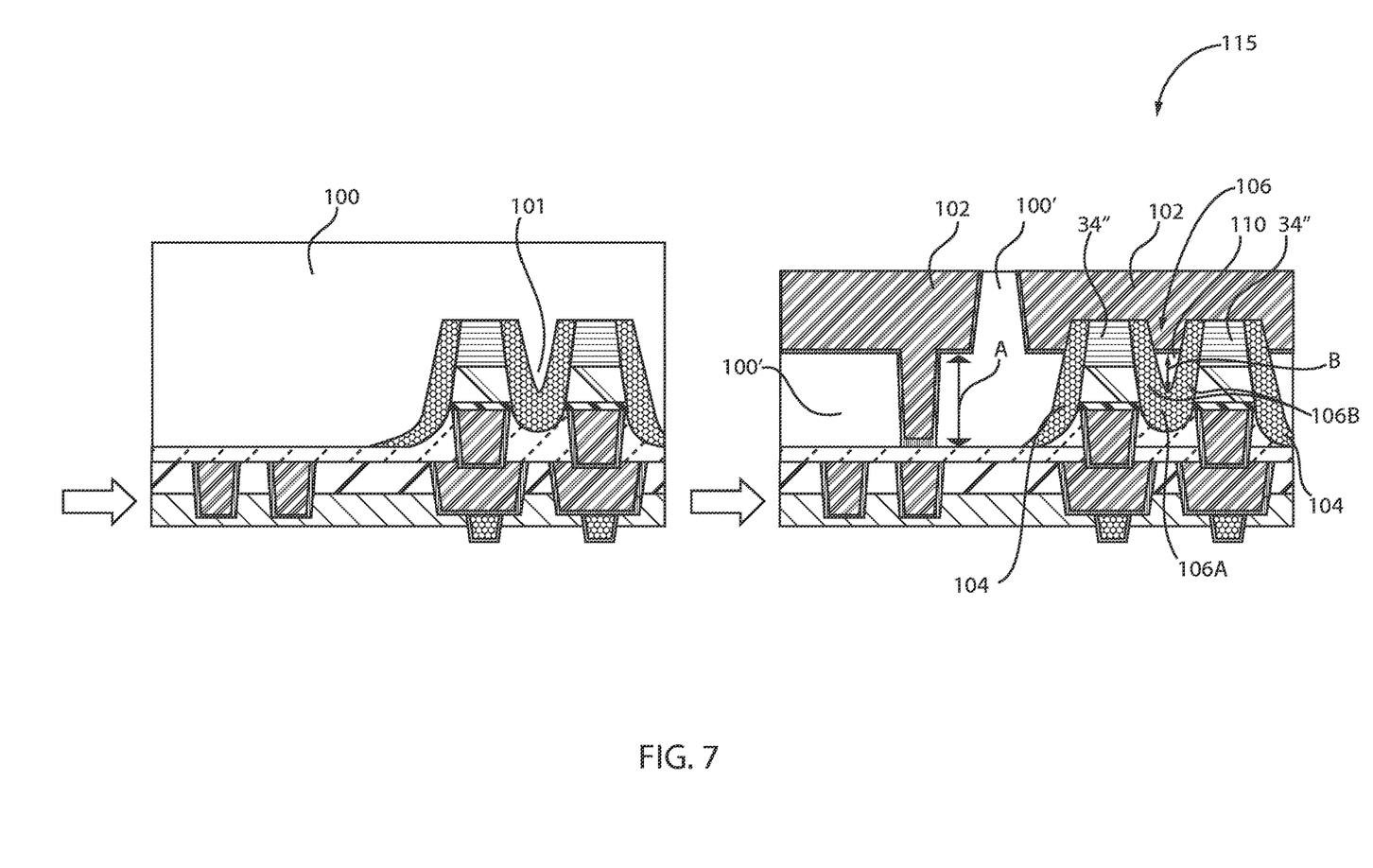
FIG. 7 is a cross-sectional view of the semiconductor structure of FIG. 6 where a dielectric fill takes place and top electrode contacts are formed, in accordance with an embodiment of the present invention.

FIG. 7 is a cross-sectional view of the semiconductor structure of FIG. 6 where a dielectric fill takes place and top electrode contacts are formed, in accordance with an embodiment of the present invention.

In various exemplary embodiments, a dielectric fill 100 takes place and top electrode contacts 102 are subsequently formed after the dielectric is etched. The dielectric fill 100 extends into region 101 defined between the MRAM pillars 80. The remaining dielectric is designated as 100'. The top electrode contact 102 directly contacts top portions of the pair of MRAM pillars 80. In particular, the top electrode contact 102 directly contacts the top electrode 34" of the MRAM pillar 80.

The etching results in encapsulation layer portions 104, 106 in structure 115. Encapsulation layer portions 104 are defined on outer surfaces of the pair of MRAM pillars 80, whereas encapsulation layer portion 106 is defined in an area or region defined directly between the pair of MRAM pillars

80. Encapsulation layer portion 106 defines upper portions 106B and lower portion 106A. The encapsulation layer portion 106 defines a substantially or generally V-shaped configuration such that a small dielectric region 110 is formed within upper portions 106B of encapsulation layer portion 106. The lower portion 106A of encapsulation layer portion 106 directly contacts the dielectric capping layer section 24'.

Distance "A" denotes an amount of dielectric between the dielectric capping layer section 24' and a bottom surface of the top electrode contact 102. Distance "B" denotes the dielectric between the encapsulation layer portion 106 and a bottom surface of another top electrode contact 102. The dielectric completely fills this region between the V-shaped gap. Thus, a depth of the gap between MRAM pillars 80 in the tight pitch region is smaller than other wider pitch regions or logic areas, such that B<A. Void free dielectric fill is also ensured.

The dielectric region 110 does not include any voids. Thus, the aspect ratio of the gap between MRAM pillars 80 in a tight pitch region is reduced to ensure a void free dielectric fill. The dielectric region 110 does not extend below a bottom surface of the MRAM pillars 80. A height (and/or pitch) of the dielectric region 110 is indicated by arrow "B." The dielectric region 110 is less than or smaller than the dielectric region 78 of FIG. 4.

In summary, an aspect ratio of a tight pitch gap is reduced by retaining more dielectric in the tight pitch gap. The exemplary structure and method enables dielectric fill for tight pitch MRAM pillar arrays for 22 nm and 14 nm embedded MRAM technology nodes and beyond. In one example, a high angle IBE (>50d) is used during pillar patterning to reduce dielectric erosion in the tight pitch gaps and in another example a high angle IBE (>50d) is used for etching back encapsulation to further increase dielectric retention in the narrow gap. Regarding the exemplary structure, the depth of the gap between the pillars in the tight pitch region is smaller than other wider pitch region or logic area (B<A). Regarding the exemplary method, the aspect ratio of the gap between two MRAM pillars in the tight pitch region is reduced to ensure a void free dielectric fill. In one of the embodiments, the aspect ratio of the tight pitch gap is reduced by retaining more dielectric during the MRAM pillar formation and encapsulation etch back process. In another embodiment, the sidewall profile of the gap is modified along with the depth to enable a better fill of the dielectric.

Regarding FIGS. 1-7, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90° or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for enabling a dielectric fill for tight pitch magnetic or magnetoresistive random access memory (MRAM) pillar arrays (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:
a bottom electrode contact disposed over one or more of a plurality of conductive lines;
magnetoresistive random access memory (MRAM) pillars constructed over the bottom electrode contact;
an encapsulation layer section disposed continuously between a pair of the MRAM pillars such that a thickness of the encapsulation layer in a tight pitch gap between the MRAM pillars is greater than a thickness of the encapsulation layer on sidewalls of the MRAM pillars so that an aspect ratio of the tight pitch gap is reduced by decreasing a height of the tight pitch gap; and
a dielectric disposed within the encapsulation layer section, wherein the dielectric fills an entirety of a space defined within the encapsulation layer section.

2. The semiconductor device of claim 1, wherein the MRAM pillars have a generally rectangular-shaped configuration and the encapsulation layer section has a generally U-shaped configuration.

3. The semiconductor device of claim 1, wherein the MRAM pillars have a generally cone-shaped configuration and the encapsulation layer section has a generally V-shaped configuration.

4. The semiconductor device of claim 1, wherein construction of the MRAM pillars results in a dielectric capping layer section formed between the MRAM pillars.

5. The semiconductor device of claim 4, wherein the dielectric capping layer section is positioned directly underneath the encapsulation layer section.

6. The semiconductor device of claim 5, wherein a top electrode contact is formed over exposed top portions of the MRAM pillars.

7. The semiconductor device of claim 6, wherein the top electrode contact directly contacts top surfaces of the encapsulation layer section.

8. The semiconductor device of claim 7, wherein a height of the dielectric disposed within the encapsulation layer section is less than a height defined between a bottom surface of the top electrode contact and a top surface of the dielectric capping layer section.

9. The semiconductor device of claim 1, wherein the dielectric disposed within the encapsulation layer section extends above a top surface of the bottom electrode contact.

10. A method for forming an embedded magnetoresistive random access memory (MRAM) device, the method comprising:
forming a bottom electrode contact over one or more of a plurality of conductive lines;
constructing MRAM pillars over the bottom electrode contact;
depositing an encapsulation layer over the MRAM pillars to define a tight pitch gap between a pair of the MRAM pillars;
etching the encapsulation layer to form a generally U-shaped gap between the pair of MRAM pillars such that an aspect ratio of the tight pitch gap is reduced; and depositing a dielectric within the generally U-shaped gap between encapsulation layer portions of two adjacent MRAM pillars, wherein the dielectric fills an entirety of a space defined within the generally U-shaped gap.

11. The method of claim 10, wherein the bottom electrode contact is formed within a capping layer before the construction of the MRAM pillars.

12. The method of claim 11, wherein construction of the MRAM pillars results in a dielectric capping layer section formed between the MRAM pillars.

13. The method of claim 12, wherein the dielectric capping layer section defines the tight pitch gap.

14. The method of claim 12, wherein the dielectric capping layer section is positioned directly underneath the generally U-shaped gap.

15. The method of claim 10, wherein a top electrode contact is formed over exposed top portions of the MRAM pillars.

16. The method of claim 15, wherein the top electrode contact directly contacts a top surface of the dielectric.

17. The method of claim 15, wherein the top electrode contact directly contacts top surfaces of the generally U-shaped gap.

18. The method of claim 10, wherein the MRAM pillars have a rectangular-shaped configuration.

19. A method for forming an embedded magnetoresistive random access memory (MRAM) device, the method comprising:

forming a bottom electrode contact over one or more of a plurality of conductive lines;

constructing MRAM pillars over the bottom electrode contact, wherein the MRAM pillars have a cone-shaped configuration;

depositing an encapsulation layer over the MRAM pillars to define a tight pitch gap between a pair of the MRAM pillars;

etching the encapsulation layer to form a generally V-shaped gap between the pair of MRAM pillars such that an aspect ratio of the tight pitch gap is reduced; and depositing a dielectric within the generally V-shaped gap between encapsulation layer portions of two adjacent MRAM pillars, wherein the dielectric fills an entirety of a space defined within the generally V-shaped gap.

20. The method of claim 19, wherein construction of the MRAM pillars results in a dielectric capping layer section formed between the MRAM pillars such that the dielectric capping layer section defines the tight pitch gap.

* * * * *